United States Patent
Ou et al.

(10) Patent No.: US 7,355,210 B2
(45) Date of Patent: Apr. 8, 2008

(54) HIGH-EFFICIENCY LIGHT-EMITTING ELEMENT

(75) Inventors: Chen Ou, Hsin-Chu (TW); Ting-Yang Lin, Hsin-Chu (TW); Jia-Rong Chang, Hsin-Chu (TW); Shih-Kuo Lai, Hsin-Chu (TW)

(73) Assignee: Epistar Corporation, Hsin-chu (TW)

( * ) Notice: Subject to any disclaimer, the term of this patent is extended or adjusted under 35 U.S.C. 154(b) by 192 days.

(21) Appl. No.: 10/906,458

(22) Filed: Feb. 21, 2005

(65) Prior Publication Data

US 2005/0211995 A1 Sep. 29, 2005

(30) Foreign Application Priority Data

Mar. 24, 2004 (TW) .............. 93108048 A

(51) Int. Cl.
*H01L 31/12* (2006.01)

(52) U.S. Cl. .................. 257/95; 257/91; 257/98; 257/E33.005; 257/E33.006; 257/E33.067; 257/E33.074

(58) Field of Classification Search ......... 257/95, 257/98, 103, E33.005, E33.006, E33.033, 257/E33.068, E33.074

See application file for complete search history.

(56) References Cited

U.S. PATENT DOCUMENTS

| | | | |
|---|---|---|---|
| 4,911,102 A * | 3/1990 | Manabe et al. | ............. 118/719 |
| 5,779,924 A | 7/1998 | Krames et al. | |
| 6,078,064 A | 6/2000 | Ming-Jiunn et al. | |
| 6,504,180 B1 * | 1/2003 | Heremans et al. | ............. 257/98 |
| 6,657,236 B1 | 12/2003 | Thibeault et al. | |
| 2002/0145148 A1 | 10/2002 | Okuyama et al. | |
| 2002/0179918 A1 * | 12/2002 | Sung et al. | ................... 257/99 |
| 2003/0040167 A1 | 2/2003 | Nagasawa et al. | |
| 2003/0218179 A1 * | 11/2003 | Koide et al. | .................. 257/95 |
| 2004/0189184 A1 * | 9/2004 | Yasuda | ...................... 313/498 |

FOREIGN PATENT DOCUMENTS

| | | |
|---|---|---|
| DE | 102 60 937 A1 | 7/2004 |
| EP | 0 977 280 A2 | 2/2000 |
| EP | 1363334 A1 | 11/2003 |
| JP | 6-291368 | 10/1994 |
| JP | 10-189480 | 7/1998 |
| JP | 2000-101142 | 4/2000 |
| JP | 2000-244070 | 8/2000 |
| JP | 2002-299769 | 10/2002 |
| JP | 2003-060236 | 2/2003 |
| TW | 144415 | 10/2001 |
| WO | WO 2004/057680 A1 | 7/2004 |

* cited by examiner

*Primary Examiner*—Minhloan Tran
*Assistant Examiner*—Benjamin Tzu-Hung Liu
(74) *Attorney, Agent, or Firm*—Quintero Law Office

(57) ABSTRACT

A high-efficiency light-emitting element includes a substrate, a first nitride semiconductor layer formed on the substrate, a nitride light-emitting layer formed on the first nitride semiconductor layer, and a second nitride semiconductor layer formed on the nitride light-emitting layer including a plurality of hexagonal-pyramid cavities on the surface of the second nitride semiconductor layer opposite to the nitride light-emitting layer.

51 Claims, 8 Drawing Sheets

HIGH-EFFICIENCY LIGHT-EMITTING ELEMENT

BACKGROUND OF INVENTION

1. Field of the Invention

The present invention relates to a light-emitting element, and more particularly, to a high-efficiency light-emitting element.

2. Description of the Prior Art

The applications of light-emitting diodes are extensive and include optical display devices, traffic signals, data storing devices, communication devices, illumination devices, and medical apparatuses.

The conventional light-emitting diode includes a substrate, a first electrode semiconductor layer formed on the substrate, a light-emitting layer formed on the first electrode semiconductor layer, a second electrode semiconductor layer formed on the light-emitting layer, and a transparent conductive layer formed on the second electrode semiconductor layer. LED light travels in each direction instead of focusing on one place. However, the light generated from an LED is not easily emitted from the LED. According to Snell's law, only light emitted at an angle within the critical angle θc would be completely emitted out, and other light would be reflected and absorbed. In other words, the angle of LED light must be within a cone of 2θc for light to be completely emitted out. Light emitted at an angle larger than 2θc is reflected. The top surface of the conventional light-emitting diode is often a planar structure, so the critical angle is very small and most light would be reflected. The reflected light is absorbed by the semiconductor material so that the light-emitting efficiency is reduced. Therefore, it is important to prevent the light from reflecting completely so as to increase the light-emitting efficiency.

The conventional solution to solve the above-mentioned problem is to form a microlens on the top layer of the LED so that the critical angle can be increased and most light would be completely emitted so as to increase the light output of the LED. The other solution is to apply photonic crystal technology to overcome the total reflection effect so as to increase the light-emitting efficiency. However these prior arts techniques require complicated manufacturing processes, which increases both the difficulty of the LED process and the cost. Furthermore, in theese prior arts the semiconductor layer with a certain thickness on the light-emitting layer is required as a window layer or a contact layer, and the light emitted from the light-emitting layer to the semiconductor layer would be partially absorbed by the semiconductor layer. So these prior arts can solve the problem of the total reflection but they cannot overcome the light absorption of the semiconductor layer.

SUMMARY OF INVENTION

It is therefore a primary objective of the claimed invention to provide a high-efficiency light-emitting element to overcome the drawbacks of these prior arts.

According to the claimed invention, a high-efficiency light-emitting element includes a substrate, a first nitride semiconductor layer formed on the substrate, a nitride light-emitting layer formed on the first nitride semiconductor layer, and a second nitride semiconductor layer formed on the nitride light-emitting layer having a plurality of hexagonal-pyramid cavities on the surface of the second nitride semiconductor layer opposite to the nitride light-emitting layer, wherein the hexagonal-pyramid cavity extends downward from the surface of the second nitride semiconductor layer.

Because the lattice orientation of the nitride material has a hexagonal character, the hexagonal-pyramid cavity can be generated in the nitride material with the lattice character. The hexagonal-pyramid cavity formed on the surface not only increases the total light-emitting area, but also decreases the light loss due to the total reflection when the light generated from the light-emitting layer passes through the surface. In addition, because the hexagonal-pyramid cavity extends from the surface downward, the light that emits into the hexagonal-pyramid cavity would not decay due to the absorption of the semiconductor material. That is, the present invention can reduce the light transmission distance in the upper semiconductor layer of the light-emitting layer and reduce the possibility of being absorbed by the semiconductor material so as to improve the light-emitting efficiency of the light-emitting element.

According to the claimed invention, a high-efficiency light-emitting element includes a substrate, and a first nitride semiconductor layer formed on the substrate including a first surface being distant from the substrate, and a second surface being distant from the substrate and including a plurality of hexagonal-pyramid cavities. The high-efficiency light-emitting element further includes a nitride light-emitting layer formed on the first surface, and a second nitride semiconductor layer formed on the nitride light-emitting layer.

These and other objectives of the claimed invention will no doubt become obvious to those of ordinary skill in the art after reading the following detailed description of the preferred embodiment that is illustrated in the various figures and drawings.

DETAILED DESCRIPTION

Embodiment 1

Figure 1:
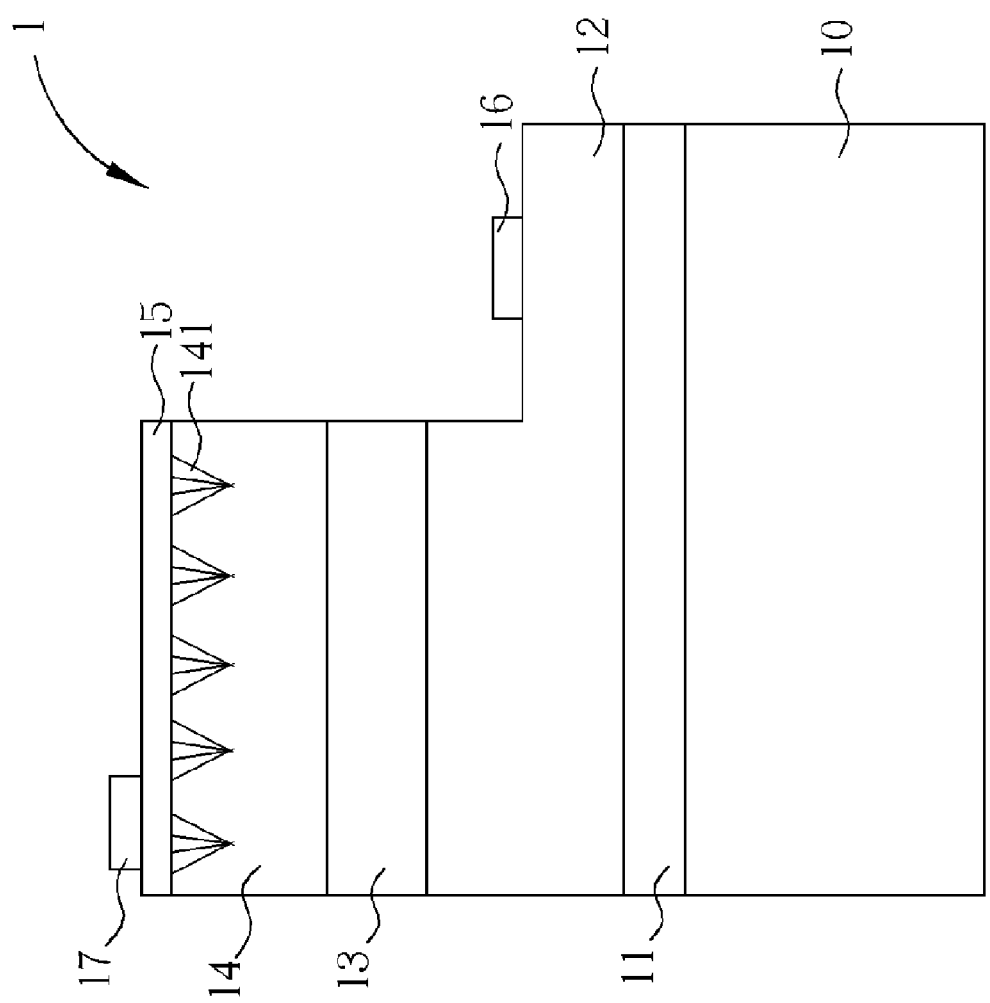
FIG. 1 is a diagram of a high-efficiency light-emitting element according to a first embodiment of the present invention.
Figure 2:
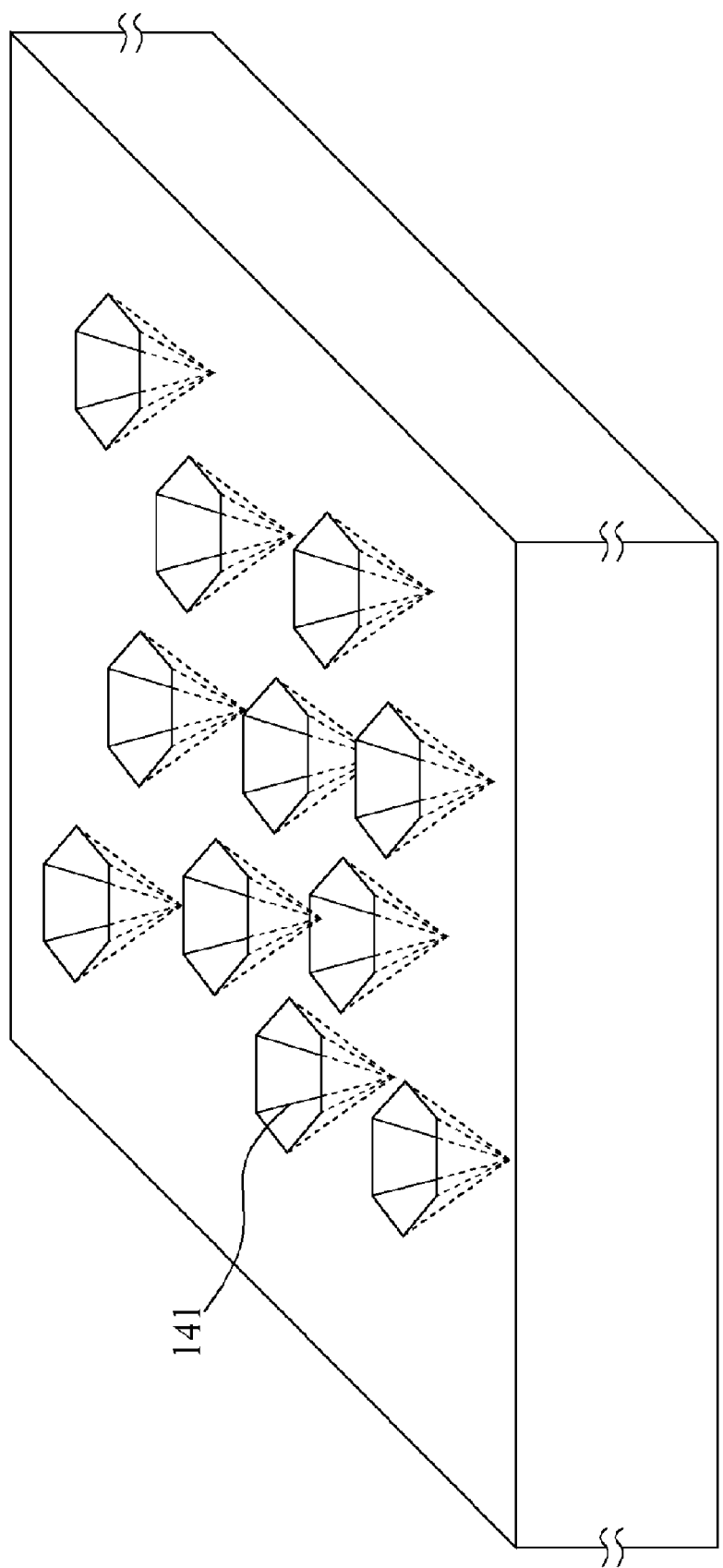
FIG. 2 is a diagram of illustrating a plurality of hexagonal-pyramid cavities formed on the surface of a p-type nitride semiconductor layer.

Please refer to FIG. 1. FIG. 1 is a diagram of a high-efficiency light-emitting element 1 according to a first embodiment of the present invention. The high-efficiency light-emitting element 1 includes a sapphire substrate 10, a nitride buffer layer 11 formed on the sapphire substrate 10, and a n-type nitride semiconductor layer 12 formed on the nitride buffer layer 11. The n-type nitride semiconductor layer 12 includes a first surface and a second surface distant from the nitride buffer layer 11. The high-efficiency light-emitting element 1 further includes a nitride multiple-quantum well light-emitting layer 13 formed on the first surface, and a p-type nitride semiconductor layer 14 formed on the nitride multiple-quantum well light-emitting layer 13. The p-type nitride semiconductor layer 14 includes a plurality of hexagonal-pyramid cavities 141 on the surface and a distance from the nitride multiple-quantum well light-emitting layer 13, wherein the hexagonal-pyramid cavity extends downward from the surface of the second nitride semiconductor layer. The high-efficiency light-emitting element 1 further includes a transparent conductive layer 15 formed on the p-type nitride semiconductor layer 14, and the transparency of the transparent conductive layer 15 is above 50% for wavelength range is between 300 nm and 700 nm. The high-efficiency light-emitting element 1 further includes an n-type electrode 16 formed on the second surface of the n-type nitride semiconductor layer 12, and a p-type electrode 17 formed on the transparent conductive layer 15. FIG. 2 is a diagram illustrating the plurality of hexagonal-pyramid cavities 141 formed on the surface of the p-type nitride semiconductor layer 14. The plurality of hexagonal-pyramid cavities 141 is formed inside the p-type nitride semiconductor layer 14. The surfactant, such as Si or Mg, can be provided for changing the crystal nucleation of the hexagonal-pyramid cavities 141 so as to form the hexagonal-pyramid cavities 141 on the surface of the p-type nitride semiconductor layer 14 or inside the p-type nitride semiconductor layer 14 when the initial layers of the hexagonal-pyramid cavities 141 grow. The magnitude and the time sequence of the surfactant can determine the size and the density of the plurality of hexagonal-pyramid cavities 141 so as to change the light-emitting efficiency.

The structures of the hexagonal-pyramid cavities 141 are related to the physical crystal property of nitride, and the shape and angle of such structures depends on the crystal property of nitride. Take C-(0001) sapphire substrate for example. Each angle between each adjacent pyramid surface is about 120 degrees substantially, and the pyramid surfaces includes a (10-11) or (11-22) lattice surface group. The angle between the pyramid surface and the central normal of the hexagonal-pyramid cavity 141 is about 60 degrees substantially.

Embodiment 2

The configuration of embodiment 2 is similar to embodiment 1, and the difference between embodiment 1 and embodiment 2 is as follows, the initial layers of the hexagonal-pyramid cavities 141 grow between the epitaxial temperature 700° C. and 950° C. for changing the crystal nucleation so as to form the hexagonal-pyramid cavities 141 on the surface of the p-type nitride semiconductor layer 14 or inside the p-type nitride semiconductor layer 14. The variation of the epitaxial growth temperature and the heating or cooling can determine the size and the density of the plurality of hexagonal-pyramid cavities 141 so as to change the light-emitting efficiency.

Embodiment 3

The configuration of embodiment 3 is similar to embodiment 1, and the difference between embodiment 1 and embodiment 3 is as follows, the p-type nitride semiconductor layer is grown in a nitrogen rich environment for changing the crystal nucleation so as to form the hexagonal-pyramid cavities 141 on the surface of the p-type nitride semiconductor layer 14 or inside the p-type nitride semiconductor layer 14. The modulation of the epitaxial growth environment and the proportion of the nitrogen, hydrogen, and nitrogen source can determine the size and the density of the plurality of hexagonal-pyramid cavities 141 so as to change the light-emitting efficiency.

Embodiment 4

The configuration of embodiment 4 is similar to embodiment 1, and the difference between embodiment 1 and embodiment 4 is as follows, the surface of the p-type nitride semiconductor layer 14 can be etched by a chemical wet etching method, such as high temperature $H_3PO_4$, to form the hexagonal-pyramid cavities 141. The etching rate and the concentration of the etching solution can determine the size, the density, and the depth of the plurality of hexagonal-pyramid cavities 141 so as to change the light-emitting efficiency.

Embodiment 5

The configuration of embodiment 5 is similar to embodiment 1, and the difference between embodiment 1 and embodiment 5 is as follows, a smaller hexagonal-pyramid cavity is formed by the epitaxial method as previous embodiments, and then the hexagonal-pyramid cavity can be formed by etching the smaller hexagonal-pyramid cavity with a chemical wet etching method so as to change the light-emitting efficiency. If the hexagonal-pyramid cavity is formed by the epitaxial method directly, the stress would occur on the edge of the hexagonal-pyramid cavity so that epitaxial defect occurs. This will decrease the epitaxial quality and affect the electric character of the LED. If the smaller hexagonal-pyramid cavity is formed first by the epitaxial method and then the hexagonal-pyramid cavity is formed by etching the smaller hexagonal-pyramid cavity with the chemical wet etching method, the stress would not occur on the edge of the hexagonal-pyramid cavity and the epitaxial quality would not decrease. In addition, the bottom of the hexagonal-pyramid cavity needs to be above the nitride multiple-quantum well light-emitting layer. If the bottom of the hexagonal-pyramid cavity extends to the nitride multiple-quantum well light-emitting layer, the electrical properties of the LED would be poor.

Embodiment 6

Figure 3:
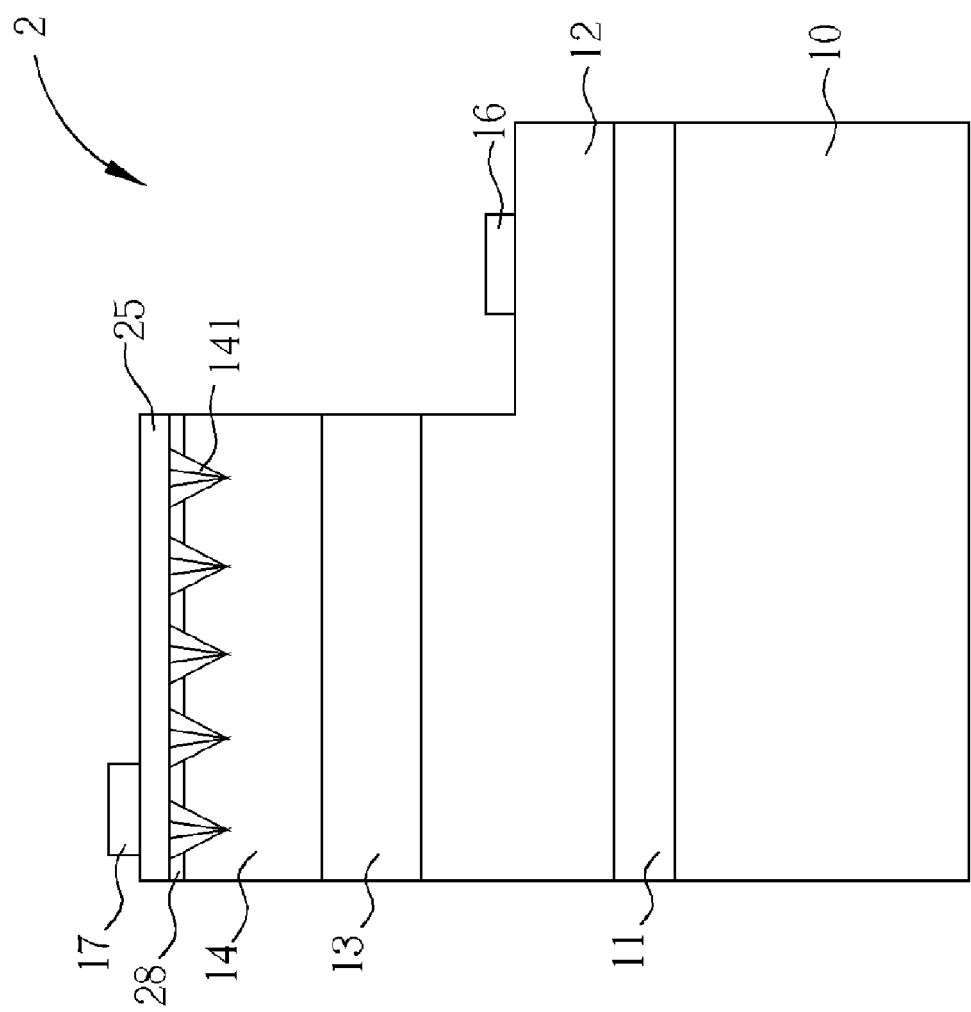
FIG. 3 is a diagram of a high-efficiency light-emitting element according to a sixth embodiment of the present invention.

Please refer to FIG. 3. FIG. 3 is a diagram of a high-efficiency light-emitting element 2 according to a sixth embodiment of the present invention. The high-efficiency light-emitting element 2 is similar to the high-efficiency light-emitting element 1, and the difference between embodiment 1 and embodiment 6 is as follows, a transparent oxide conductive layer 25 substitutes for the transparent conductive layer 15, and an invert tunneling contact layer 28 is formed between the p-type nitride semiconductor layer 14 and the transparent oxide conductive layer 25. The thickness of the invert tunneling contact layer 28 is less than 10 nm, and the carrier concentration of the invert tunneling contact layer 28 is greater than $5*10^{18}$ cm$^{-3}$. The high carrier concentration n-type invert tunneling contact layer 28 formed between the p-type nitride semiconductor layer 14 and the transparent oxide conductive layer 25 provides a perfect ohmic contact between the transparent oxide conductive layer 25 and the invert tunneling contact layer 28. When the LED operates in a forward-biased voltage, the interface between the n-type invert tunneling contact layer 28 and the p-type nitride semiconductor layer 14 operates in a reverse-biased voltage to form a depletion region. Because the n-type invert tunneling contact layer 28 is not thick, the carriers inside the transparent oxide conductive layer 25 can inject into the p-type nitride semiconductor layer 14 by a tunnel effect so that the LED has a low operating biased voltage. A thin metallic conductive layer can substitute the transparent oxide conductive layer 25 in this embodiment. A superlattice structure including at least one material selected from a material group consisting of $Al_xGa_{1-x}N$ and $In_yGa_{1-y}N$, in which $0 \leq x \leq 1$, $0 \leq y \leq 1$ and x and y can not be 0 at the same time, can substitute the invert tunneling contact layer 28.

Embodiment 7

Figure 4:
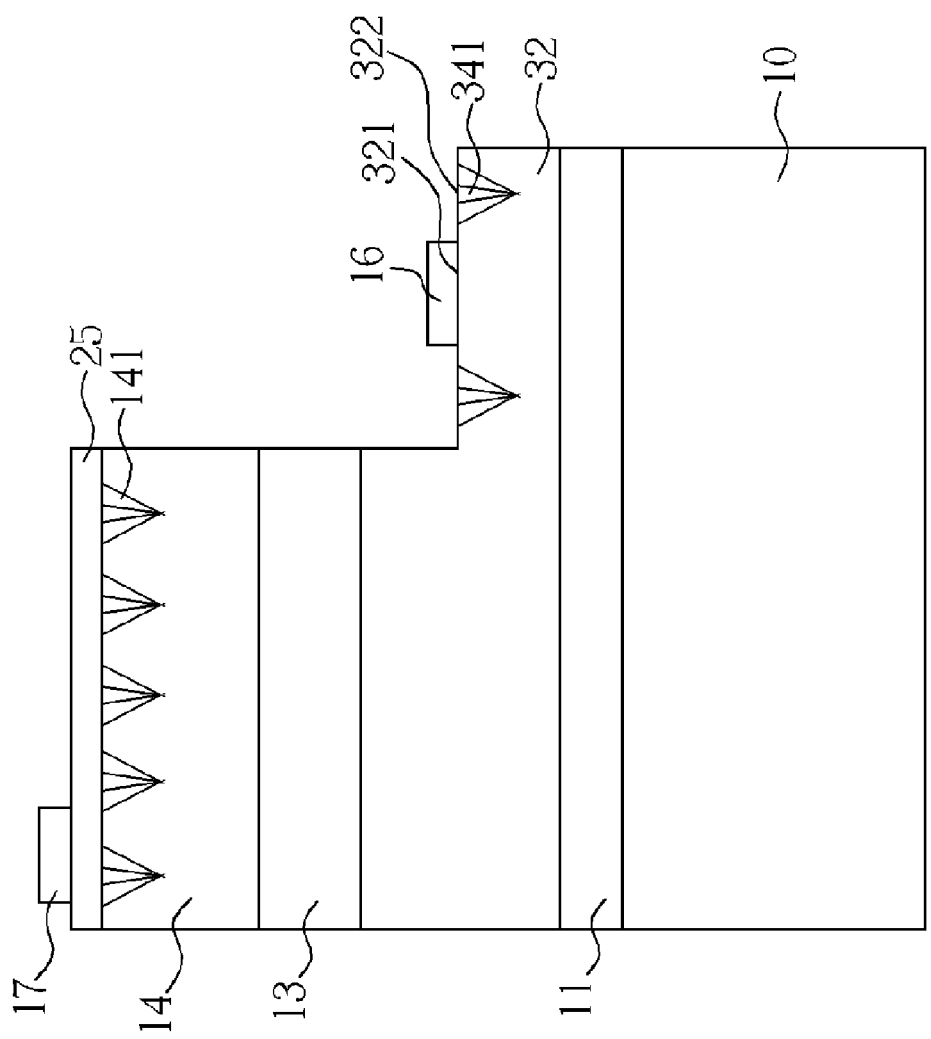
FIG. 4 is a diagram of a high-efficiency light-emitting element according to a seventh embodiment of the present invention.

Please refer to FIG. 4. FIG. 4 is a diagram of a high-efficiency light-emitting element 3 according to a seventh embodiment of the present invention. The high-efficiency light-emitting element 3 is similar to the high-efficiency light-emitting element 1, and the difference between embodiment 7 and embodiment 1 is as follows, an n-type electrode contact area 321 and a non-electrode contact region 322 are formed on a second surface of an n-type nitride semiconductor layer 32. The n-type electrode 16 is formed on the n-type electrode contact area 321, and a plurality of hexagonal-pyramid cavities 341 are formed on the surface of the non-electrode contact region 322, wherein the hexagonal-pyramid cavity extends downward from the surface of non-electrode contact region. The plurality of hexagonal-pyramid cavities 341 can reduce lateral light reflected between the sapphire substrate 10 and the n-type nitride semiconductor layer 32 repeatedly so that the lateral light can emit effectively for increasing the light-emitting efficiency of the LED.

The plurality of hexagonal-pyramid cavities 141 on the surface of the p-type nitride semiconductor layer 14 of the seventh embodiment can be removed, and there is only the plurality of hexagonal-pyramid cavities 341 on the non-electrode contact region 322 of the n-type nitride semiconductor layer 32.

Figure 5:
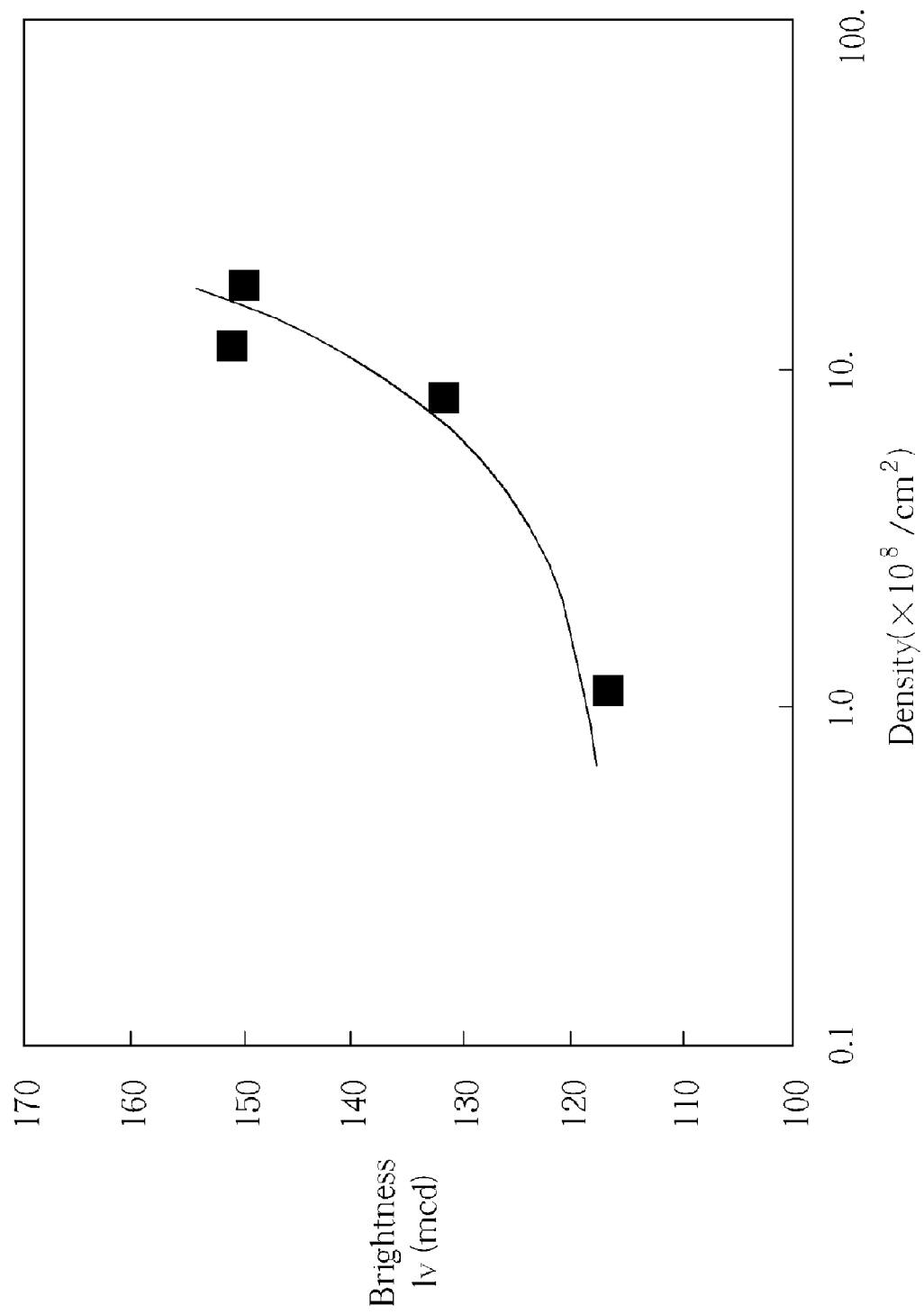
FIG. 5 is a relation diagram of the density of the hexagonal-pyramid cavities and the brightness of the high-efficiency light-emitting element according to the present invention.

Please refer to FIG. 5. FIG. 5 is a diagram of the relation between the density of the hexagonal-pyramid cavities and the brightness of the high-efficiency light-emitting element according to the present invention. As shown in FIG. 5, when the density of the plurality of the hexagonal-pyramid cavities increases from $1*10^8$ cm$^{-2}$ to $2*10^9$ cm$^{-2}$, the brightness increases from 117 mcd to 150 mcd. Therefore increasing the density of the hexagonal-pyramid cavities can indeed improve the brightness of the LED.

Figure 6:
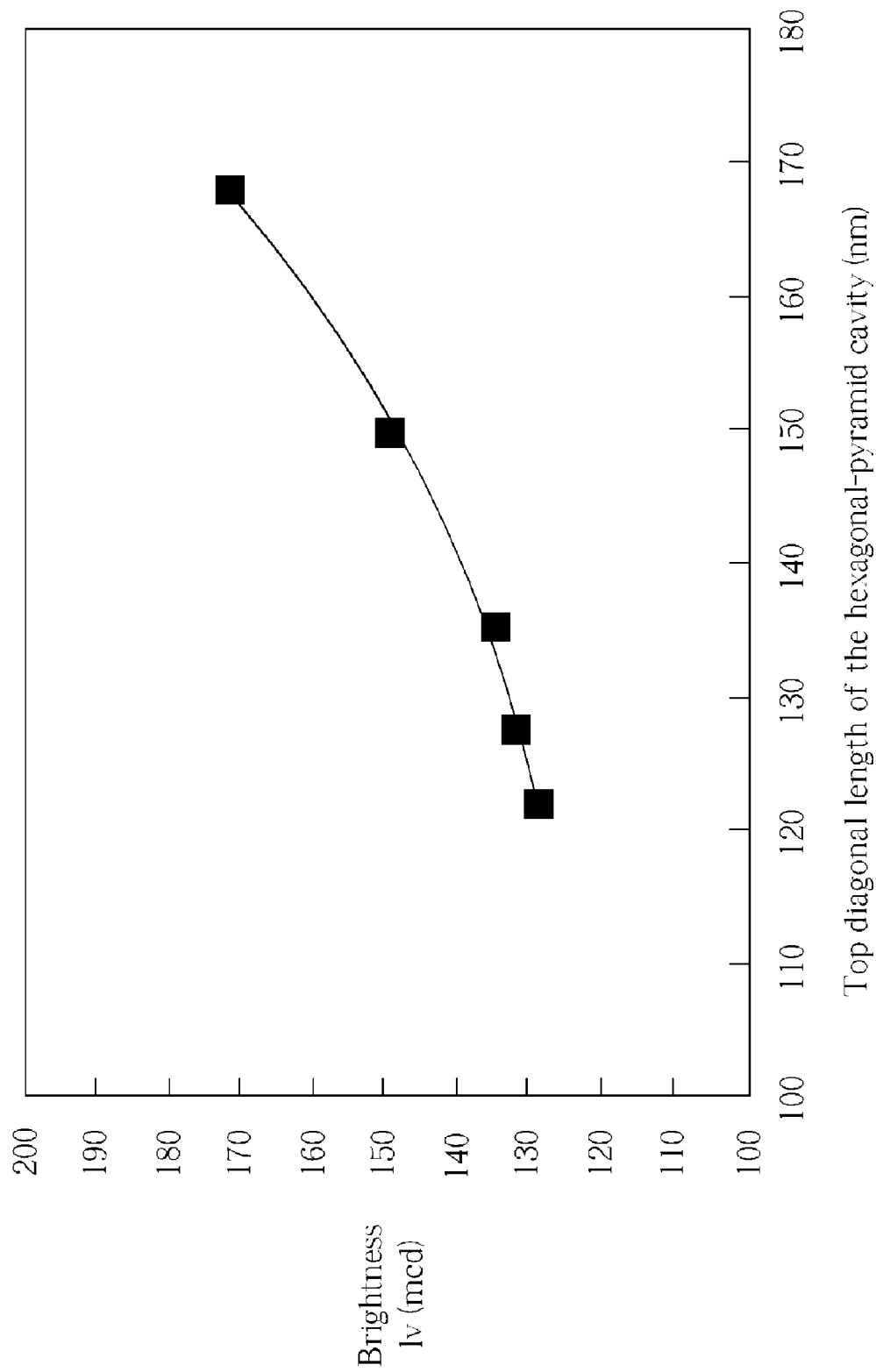
FIG. 6 is a relation diagram of the top diagonal length of the hexagonal-pyramid cavity and the brightness of the high-efficiency light-emitting element according to the present invention.

Please refer to FIG. 6. FIG. 6 is a diagram of the relation between the top diagonal length of the hexagonal-pyramid cavity and the brightness of the high-efficiency light-emitting element according to the present invention. The top diagonal length of the hexagonal-pyramid cavity is the length from the top vertex of the hexagonal-pyramid cavity to one of the vertices of the hexagon. As shown in FIG. 6, when the top diagonal length of the hexagonal-pyramid cavity increases from 122 nm to 168 nm, the brightness increases from 128 mcd to 173 mcd. Therefore enlarging the hexagonal-pyramid cavities can indeed improve the brightness of the LED.

Figure 7:
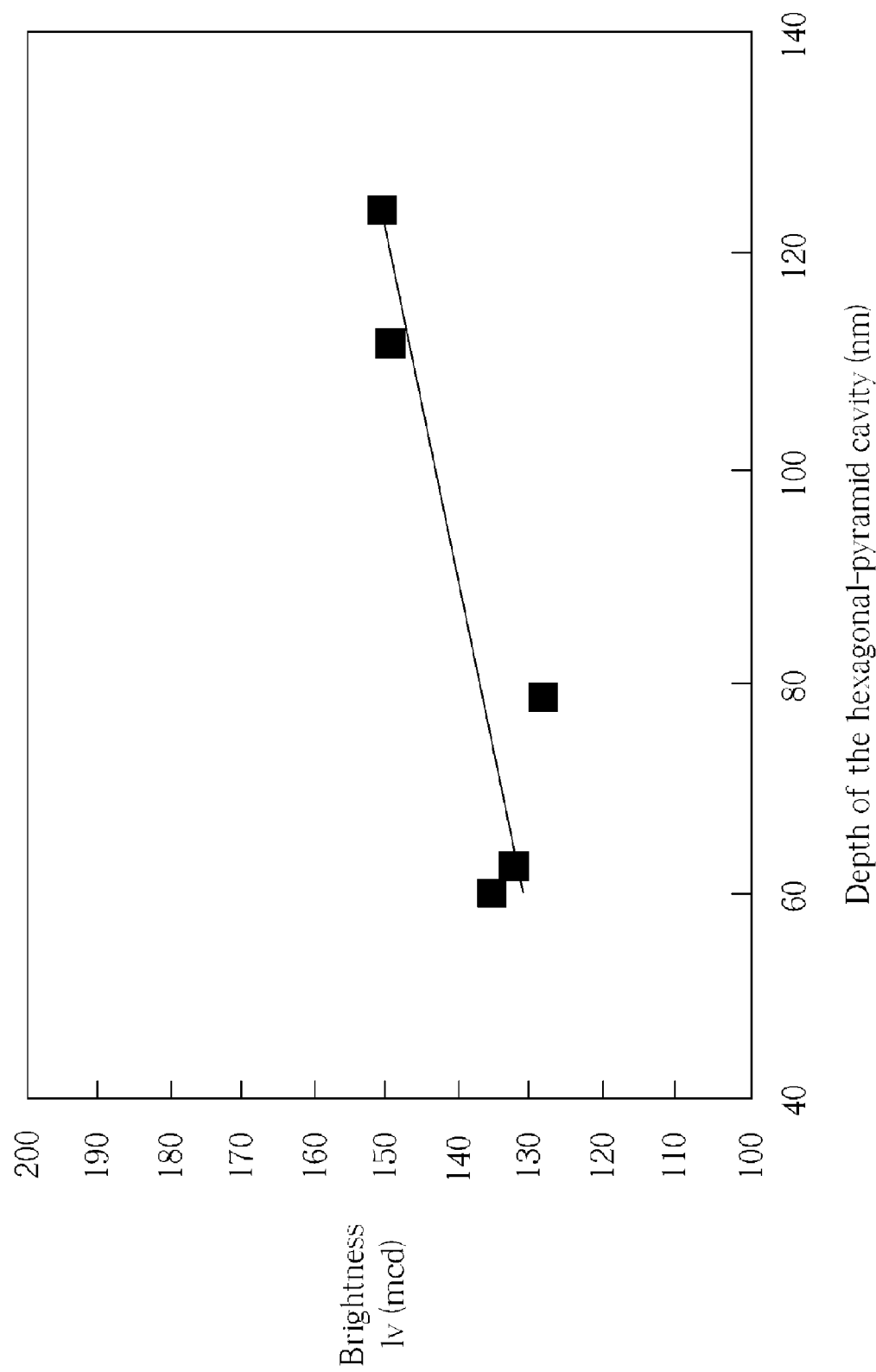
FIG. 7 is a relation diagram of the depth of the hexagonal-pyramid cavity and the brightness of the high-efficiency light-emitting element according to the present invention.

Please refer to FIG. 7. FIG. 7 is a diagram of the relation between the depth of the hexagonal-pyramid cavity and the brightness of the high-efficiency light-emitting element according to the present invention. As shown in FIG. 7, when the depth the hexagonal-pyramid cavity increases from 60 nm to 125 nm, the brightness increases from 130 mcd to 150 mcd. Therefore the deep hexagonal-pyramid cavities can indeed improve the brightness of the LED.

Figure 8:
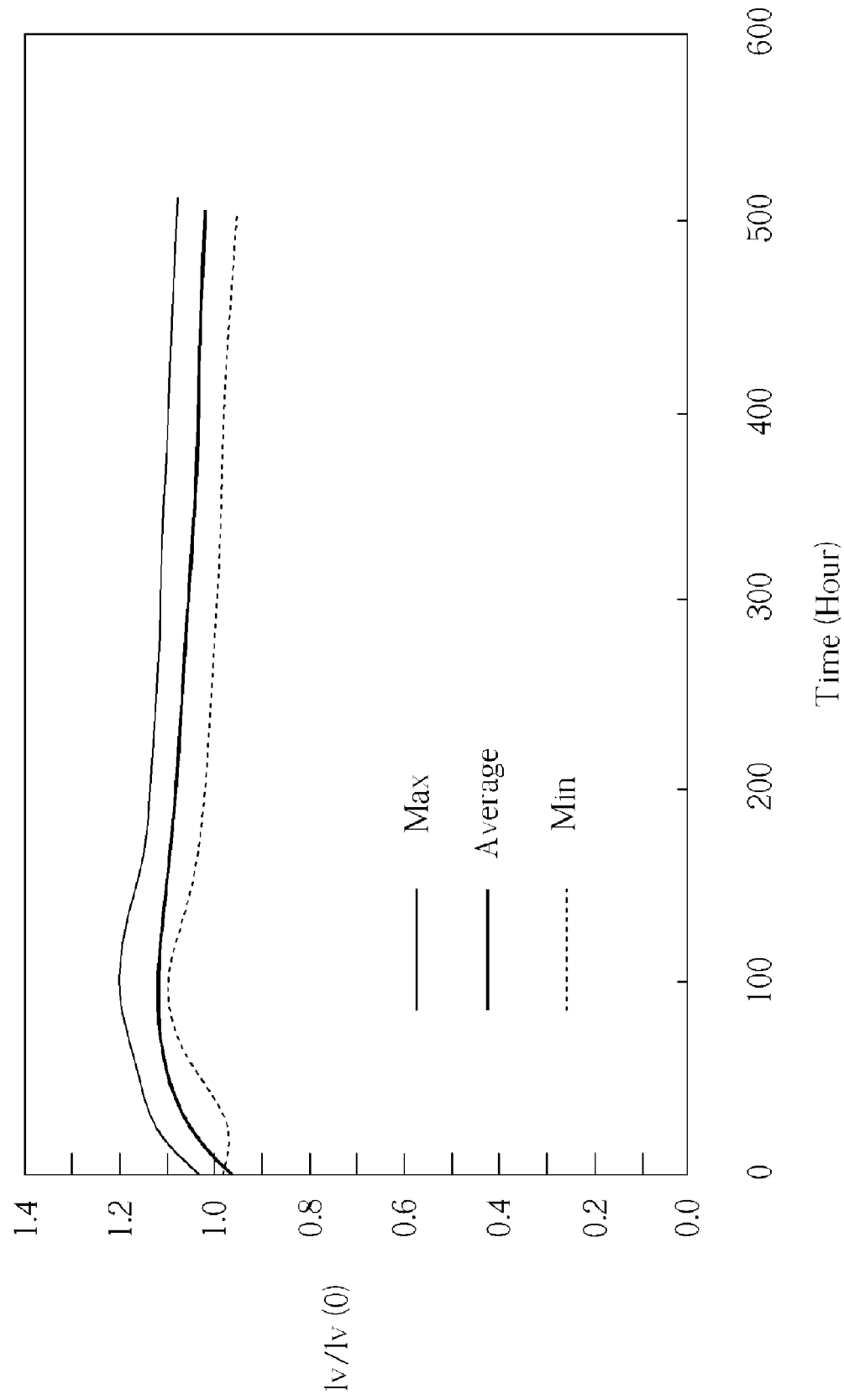
FIG. 8 is a life-testing diagram of the high-efficiency light-emitting element according to the present invention.

Please refer to FIG. 8. FIG. 8 is a life-testing diagram of the high-efficiency light-emitting element with 5 mm lamp packaging operating at room temperature and 30 mA current according to the present invention. As shown in FIG. 8, the high-efficiency light-emitting element of the present invention has an excellent reliability behavior. The lv/lv(0) is greater than 1 after a five-hundred-hour test.

In the above-mentioned embodiments, the sapphire substrate can be a (0001) or (11-20) orientation substrate and includes an off angle between 0° and 10°. The substrate can also include at least one material selected from a material group consisting of GaN, AlN, SiC, GaAs, GaP, Si, ZnO, MgO, MgAl$_2$O$_4$, glass. The nitride buffer layer can include at least one material selected from a material group consisting of AlN, GaN, AlGaN, InGaN, and AlInGaN. The nitride multiple-quantum well light-emitting layer can include at least one material selected from a material group consisting of GaN, InGaN, and AlInGaN, and a double-heterostructure or a single-quantum well structure can substitute for the nitride multiple-quantum well light-emitting layer. The p-type nitride semiconductor layer can include at least one material selected from a material group consisting of AlN, GaN, AlGaN, InGaN, and AlInGaN. The invert tunneling contact layer can include at least one material selected from a material group consisting of InGaN and GaN. The thin metallic conductive layer can include at least one material selected from a material group consisting of Al, Ti, Ti/Al, Cr/Al, Ti/Au, Cr/Au, Ni/Au, TiW, TiN, WSi, Au/Ge, Pt, Pd, Rb, or other substitute materials. The transparent oxide conductive layer can include at least one material selected from a material group consisting of indium tin oxide, cadmium tin oxide, antimony tin oxide, zinc aluminum oxide, and zinc tin oxide.

Following the detailed description of the present invention above, those skilled in the art will readily observe that numerous modifications and alterations of the device may be made while retaining the teachings of the invention. Accordingly, the above disclosure should be construed as limited only by the metes and bounds of the appended claims.

What is claimed is:
1. A high-efficiency light-emitting element comprising:
   a substrate;
   a first nitride semiconductor layer formed on and electrically isolated from the substrate;
   a nitride light-emitting layer formed on the first nitride semiconductor layer;
   a second nitride semiconductor layer formed on the nitride light-emitting layer comprising a p-type semiconductor layer; and a plurality of hexagonal-pyramid cavities extending downward from at least one of surfaces on the first nitride semiconductor layer and the second nitride semiconductor layer.

2. The high-efficiency light-emitting element of claim 1 wherein the top diagonal length of the hexagonal-pyramid cavity is between 10 nm and 1 um.

3. The high-efficiency light-emitting element of claim 1 wherein the density of the plurality of hexagonal-pyramid cavities is between $5*10^7$ cm$^{-2}$ and $1*10^{10}$ cm$^{-2}$.

4. The high-efficiency light-emitting element of claim 1 wherein the depth of the hexagonal-pyramid cavity is between 10 nm and 1 μm.

5. The high-efficiency light-emitting element of claim 1 further comprising a buffer layer between the substrate and the first nitride semiconductor layer.

6. The high-efficiency light-emitting element of claim 5 wherein the buffer layer comprises at least one material selected from a material group consisting of AlN, GaN, AlGaN, InGaN, and AlInGaN.

7. The high-efficiency light-emitting element of claim 1 further comprising a transparent conductive layer formed on the second nitride semiconductor layer.

8. The high-efficiency light-emitting element of claim 7 further comprising an invert tunneling contact layer between the second nitride semiconductor layer and the transparent conductive layer, wherein the conductivity type of the invert tunneling contact layer is opposite to the conductivity type of the second nitride semiconductor layer and carrier concentration of the invert tunneling contact layer is no less than $5*10^{18}$ cm$^{-3}$.

9. The high-efficiency light-emitting element of claim 8 wherein the invert tunneling contact layer comprises at least one material selected from a material group consisting of InGaN and GaN.

10. The high-efficiency light-emitting element of claim 7 further comprising a low-resistivity tunneling contact layer between the second nitride semiconductor layer and the transparent conductive layer, wherein the low-resistivity tunneling contact layer is a superlattice structure.

11. The high-efficiency light-emitting element of claim 10 wherein the superlattice structure comprises at least one material selected from a material group consisting of $Al_xGa_{1-x}N$ and $In_yGa_{1-y}N$, wherein $0 \leq x \leq 1$, $0 \leq y \leq 1$ and x and y can not be 0 at the same time.

12. The high-efficiency light-emitting element of claim 7 wherein the transparent conductive layer is a thin metallic conductive layer.

13. The high-efficiency light-emitting element of claim 12 wherein the thin metallic conductive layer comprises at least one material selected from a material group consisting of Al, Ti, Ti/Al, Cr/Al, Ti/Au, Cr/Au, Ni/Au, TiW, TiN, WSi, Au/Ge, Pt, Pd and Rb.

14. The high-efficiency light-emitting element of claim 7 wherein the transparent conductive layer is a transparent oxide conductive layer.

15. The high-efficiency light-emitting element of claim 14 wherein the transparent oxide conductive layer comprises at least one material selected from a material group consisting of indium tin oxide, cadmium tin oxide, antimony tin oxide, zinc aluminum oxide, and zinc tin oxide.

16. The high-efficiency light-emitting element of claim 7 wherein the transparency of the transparent conductive layer is above 50% when the wavelength range is between 300 nm and 700 nm.

17. The high-efficiency light-emitting element of claim 1 wherein the substrate is a sapphire substrate.

18. The high-efficiency light-emitting element of claim 17 wherein the sapphire substrate is a (0001) or (11-20) directional substrate and comprises an off angle between 0° and 10°.

19. The high-efficiency light-emitting element of claim 1 wherein the substrate comprises at least one material selected from a material group consisting of sapphire, GaN, AlN, SiC, ZnO, MgO, MgAl$_2$ O$_4$, and glass.

20. The high-efficiency light-emitting element of claim 1 wherein the first nitride semiconductor layer comprises at least one material selected from a material group consisting of AlN, GaN, AlGaN, InGaN, and AlInGaN.

21. The high-efficiency light-emitting element of claim 1 wherein the first nitride semiconductor layer comprises at least one n-type nitride semiconductor layer, and the second nitride semiconductor layer comprises at least one p-type nitride semiconductor layer.

22. The high-efficiency light-emitting element of claim 1 wherein the first nitride semiconductor layer comprises at least one p-type nitride semiconductor layer, and the second nitride semiconductor layer comprises at least one n-type nitride semiconductor layer.

23. The high-efficiency light-emitting element of claim 1 wherein the nitride light-emitting layer comprises at least one material selected from a material group consisting of AlN, GaN, AlGaN, InGaN, and AlInGaN.

24. The high-efficiency light-emitting element of claim 1 wherein the nitride light-emitting layer is in a double-heterostructure, a single-quantum well structure, or a multiple-quantum well structure.

25. The high-efficiency light-emitting element of claim 1 wherein the second nitride semiconductor layer comprises at least one material selected from a material group consisting of AlN, GaN, AlGaN, InGaN, and AlInGaN.

26. The high-efficiency light-emitting element of claim 1 wherein the plurality of hexagonal-pyramid cavities on the surface of the second nitride semiconductor layer are formed by an epitaxial growth method.

27. The high-efficiency light-emitting element of claim 1 wherein the plurality of hexagonal-pyramid cavities on the surface of the second nitride semiconductor layer are formed by a wet etching method.

28. The high-efficiency light-emitting element of claim 1 wherein the plurality of hexagonal-pyramid cavities on the surface of the second nitride semiconductor layer are formed by an epitaxial growth method and a wet etching method.

29. The high-efficiency light-emitting element of claim 1 wherein the distance between the bottom of the hexagonal-pyramid cavities and the top surface of the first nitride semiconductor layer is no less than the distance between the top surface of the nitride light-emitting layer and the top surface of the first nitride semiconductor layer.

30. The high-efficiency light-emitting element of claim 1 wherein the first nitride semiconductor layer comprises a first surface and a second surface distant from the substrate, and the nitride light-emitting layer is formed on the first surface.

31. The high-efficiency light-emitting element of claim 30 wherein a plurality of hexagonal-pyramid cavities are formed on the second surface of the first nitride semiconductor layer.

32. The high-efficiency light-emitting element of claim 31 wherein a first electrode is formed on the second surface of the first nitride semiconductor layer with the hexagonal-pyramid cavity.

33. The high-efficiency light-emitting element of claim 31 wherein a first electrode is formed on the second surface of the first nitride semiconductor layer without the hexagonal-pyramid cavity.

34. The high-efficiency light-emitting element of claim 31 wherein the diagonal length of the hexagonal-pyramid cavity on the second surface of the first nitride semiconductor layer is between 10 nm and 1 μm.

35. The high-efficiency light-emitting element of claim 31 wherein the density of the plurality of hexagonal-pyramid cavities on the second surface of the first nitride semiconductor layer is between $1*10^7$ cm$^{-2}$ and $1*10^{11}$ cm$^{-2}$.

36. The high-efficiency light-emitting element of claim 31 wherein the depth of the hexagonal-pyramid cavity on the second surface of the first nitride semiconductor layer is between 10 nm and 1 μm.

37. The high-efficiency light-emitting element of claim 31 wherein the hexagonal-pyramid cavities on the second surface of the first nitride semiconductor layer are formed by a wet etching method.

38. The high-efficiency light-emitting element of claim 1 wherein the substrate is a C-(0001) sapphire substrate, an angle between each adjacent pyramid surface inside the hexagonal-pyramid cavity is 120 degrees substantially, the pyramid surfaces includes a (10-11) or (11-22) lattice surface, and an angle between the pyramid surface and the central normal of the hexagonal-pyramid cavity is 60 degrees substantially.

39. A high-efficiency light-emitting element comprising:
a substrate;
a first nitride semiconductor layer formed on and electrically isolated from the substrate comprising:
  a first surface distant from the substrate; and
  a second surface distant from the substrate and comprising a plurality of hexagonal-pyramid cavities, wherein the hexagonal-pyramid cavity extends downward from the second surface of the first nitride semiconductor layer;
a nitride light-emitting layer formed on the first surface; and
a second nitride semiconductor layer formed on the nitride light-emitting layer.

40. The high-efficiency light-emitting element of claim 39 wherein the top diagonal length of the hexagonal-pyramid cavity is between 10 nm and 1 μm.

41. The high-efficiency light-emitting element of claim 39 wherein the density of the plurality of hexagonal-pyramid cavities is between $5*10^7$ cm$^{-2}$ and $1*10^{10}$ cm$^{-2}$.

42. The high-efficiency light-emitting element of claim 39 wherein the depth of the hexagonal-pyramid cavity is between 10 nm and 1 μm.

43. The high-efficiency light-emitting element of claim 39 further comprising a transparent conductive layer formed on the second nitride semiconductor layer.

44. The high-efficiency light-emitting element of claim 43 further comprising an invert tunneling contact layer between the second nitride semiconductor layer and the transparent conductive layer, wherein the conductivity type of the invert tunneling contact layer is opposite to the conductivity type of the second nitride semiconductor layer and carrier concentration of the invert tunneling contact layer is not less than $5*10^{18}$ cm$^{-3}$.

45. The high-efficiency light-emitting element of claim 43 further comprising a low-resistivity tunneling contact layer between the second nitride semiconductor layer and the transparent conductive layer, wherein the low-resistivity tunneling contact layer is in a superlattice structure.

46. The high-efficiency light-emitting element of claim 43 wherein the transparent conductive layer is a thin metallic conductive layer.

47. The high-efficiency light-emitting element of claim 43 wherein the transparent conductive layer is a transparent oxide conductive layer.

48. The high-efficiency light-emitting element of claim 43 wherein the transparancy of the transparent conductive layer is above 50% when the wavelength range is between 300 nm and 700 nm.

49. The high-efficiency light-emitting element of claim 39 wherein the substrate is a sapphire substrate.

50. The high-efficiency light-emitting element of claim 49 wherein the sapphire substrate is a (0001) or (11-20) orientation substrate and comprises an off angle between 0° and 10°.

51. The high-efficiency light-emitting element of claim 39 wherein the plurality of hexagonal-pyramid cavities are formed by a wet etching method.

* * * * *